United States Patent

Weber

[11] Patent Number: 6,038,136
[45] Date of Patent: Mar. 14, 2000

[54] CHIP PACKAGE WITH MOLDED UNDERFILL

[75] Inventor: Patrick O. Weber, San Jose, Calif.

[73] Assignee: Hestia Technologies, Inc., Sunnyvale, Calif.

[21] Appl. No.: 08/959,927

[22] Filed: Oct. 29, 1997

[51] Int. Cl.[7] .................................................. H01L 23/31
[52] U.S. Cl. .......................... 361/783; 361/760; 257/738; 257/778; 257/787; 257/789; 174/260; 438/126; 228/180.22
[58] Field of Search .................................... 174/260, 261; 228/180.22; 257/738, 778, 780, 788, 787, 789; 361/760, 783; 438/126, 127; 439/68, 83

[56] References Cited

U.S. PATENT DOCUMENTS

| | | | |
|---|---|---|---|
| 4,143,456 | 3/1979 | Inoue | 257/787 |
| 4,770,899 | 9/1988 | Zeller . | |
| 4,859,722 | 8/1989 | Shiobara . | |
| 5,203,076 | 4/1993 | Banerji et al. . | |
| 5,218,234 | 6/1993 | Thompson et al. | 257/787 |
| 5,249,101 | 9/1993 | Frey et al. . | |
| 5,323,947 | 6/1994 | Juskey et al. . | |
| 5,380,560 | 1/1995 | Kaja et al. . | |
| 5,385,869 | 1/1995 | Liu et al. | 438/127 |
| 5,535,101 | 7/1996 | Miles et al. . | |
| 5,557,150 | 9/1996 | Variot et al. | 257/787 |
| 5,581,122 | 12/1996 | Chao et al. | 257/738 |
| 5,619,070 | 4/1997 | Kozono | 257/738 |
| 5,641,996 | 6/1997 | Omoya et al. | 257/787 |
| 5,700,723 | 12/1997 | Barber . | |
| 5,708,304 | 1/1998 | Tomita | 257/778 |
| 5,710,071 | 1/1998 | Beddingfield et al. . | |
| 5,731,231 | 3/1998 | Miyajima . | |
| 5,767,446 | 6/1998 | Ha et al. | 174/260 |
| 5,814,882 | 9/1998 | Shimada et al. | 257/787 |
| 5,827,999 | 10/1998 | McMillan et al. | 257/788 |
| 5,841,192 | 11/1998 | Exposito | 257/787 |
| 5,892,290 | 4/1999 | Chakravorty et al. | 257/787 |

OTHER PUBLICATIONS

IBM Technical Disclosure Bulletin "Access Entry Port" vol. 38 No. 12 pp. 131 and 132, Dec. 1995.
Moore, Kevin, et al., "Solder Joint Reliability of Fine Solder Bumped Pad Array Carriers", Motorola, Inc. pp. 264–274.

*Primary Examiner*—Leo P. Picard
*Assistant Examiner*—John B. Vigushin
*Attorney, Agent, or Firm*—Burns Doane Swecker & Mathis LLP

[57] ABSTRACT

An integrated circuit chip package according to the present invention includes an integrated circuit chip mounted on a substrate by a plurality of solder bumps. A mold compound is used for underfilling air gaps between the chip and the substrate. The integrated circuit chip package is formed by placing the chip and substrate within a mold cavity and pressing a transfer mold compound into the mold cavity. Air spaces between the integrated circuit chip and the substrate are underfilled by the mold compound as it is pressed in between the integrated circuit chip and the substrate. Air is allowed to escape from between the chip and the substrate during the underfilling through a vent which extends through the substrate. The underfilling material may also be used to encapsulate the chip at the same time that underfilling is performed.

12 Claims, 3 Drawing Sheets

FIG. 1
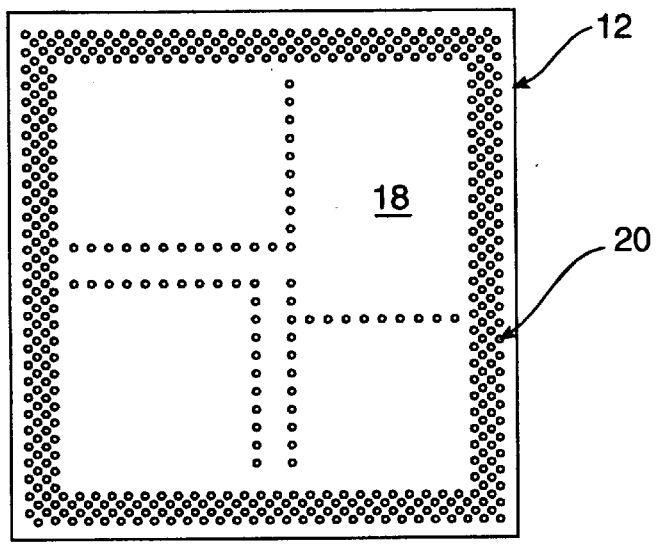
FIG. 2
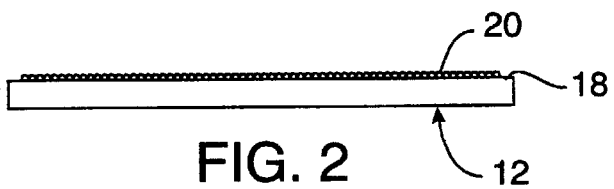
FIG. 3
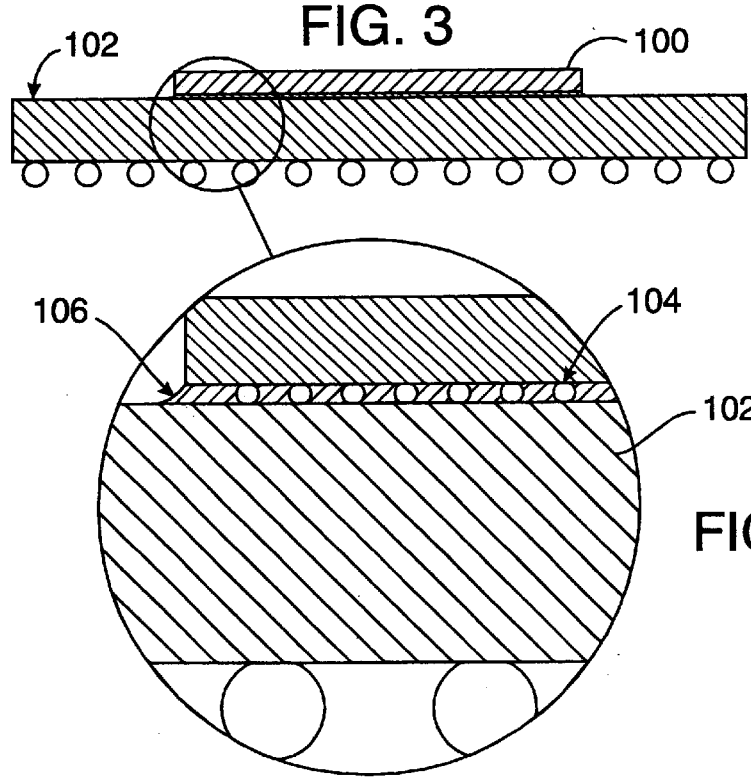
FIG. 3a

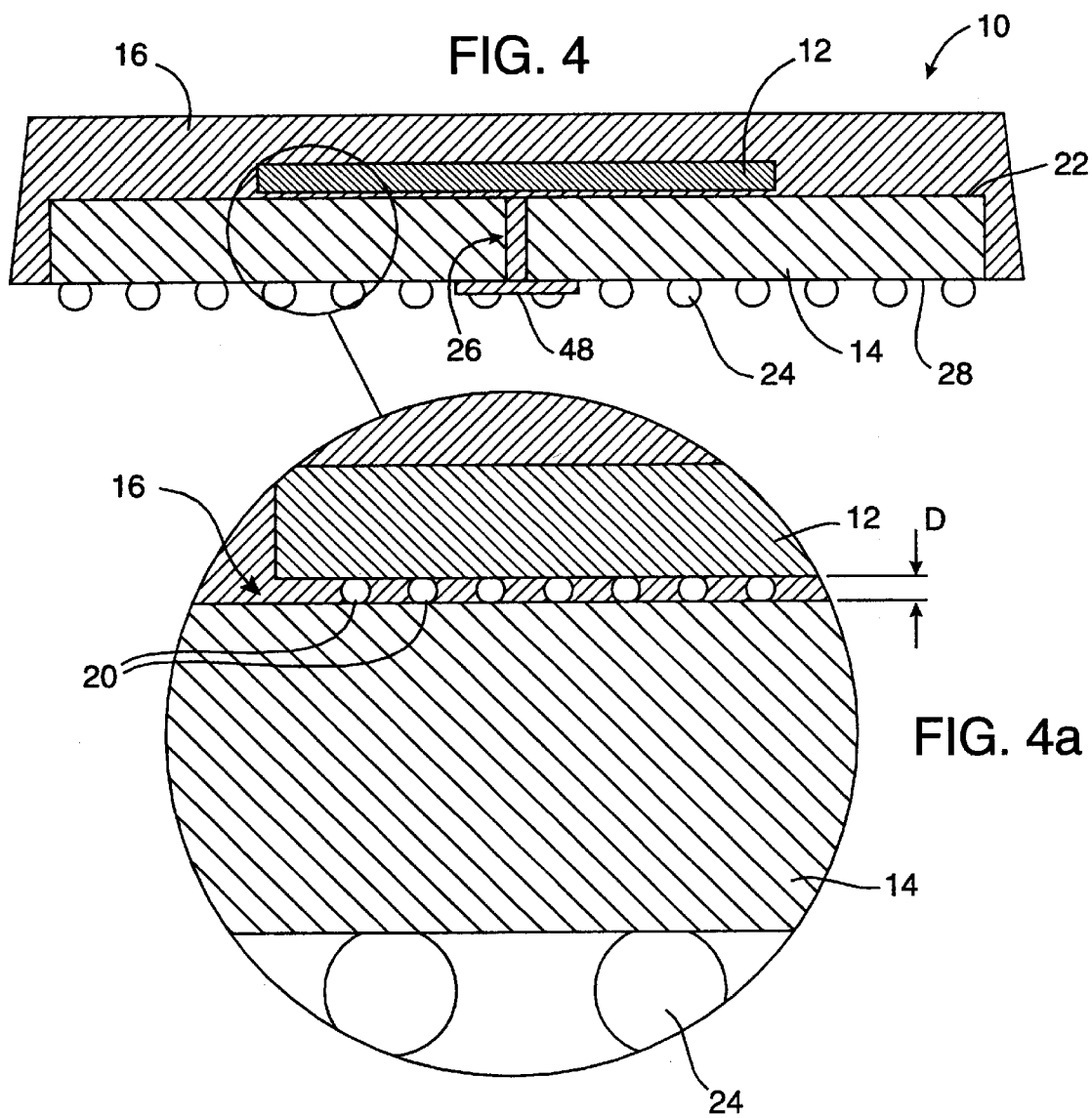
FIG. 4
FIG. 4a
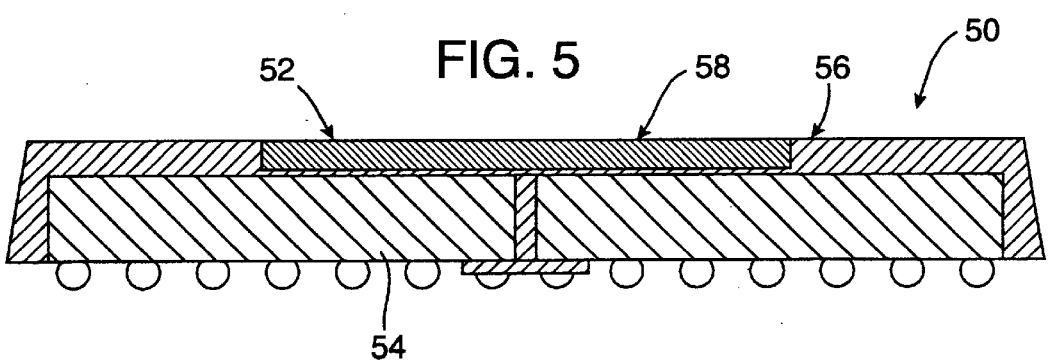
FIG. 5

CHIP PACKAGE WITH MOLDED UNDERFILL

FIELD OF THE INVENTION

The invention relates to an integrated circuit chip mounting system and more particularly, to an integrated circuit chip package and a method of electrically connecting and mounting integrated circuit chips to a substrate.

BACKGROUND OF THE INVENTION

Flip chip technology is well known in the art for electrically connecting an integrated circuit chip to an integrated circuit substrate or package. Formation of one type of flip chip involves forming solder bumps on electrical interconnection pads on the active or front side of a semiconductor chip. The chip with solder bumps is then inverted onto a laminate substrate with the solder bumps aligned with metal circuits provided on the substrate. The solder bumps on the chip are then soldered to the metal pads on the substrate by melting the solder in a reflow furnace. A solder joint is formed by the reflowing of the solder between the semiconductor chip and the substrate. After the chip has been attached to the substrate by the reflow soldering process, narrow gaps are present between the solder bumps.

The substrate is typically comprised of a ceramic material or a polymer composite laminate, while the chip is formed of silicon. Due to these different materials, there is a mismatch in the coefficient of thermal expansion between the semiconductor chip and the substrate on which the chip is mounted. During temperature cycling the semiconductor chip and substrate expand and contract at differing rates. Accordingly, the soldered joints between the semiconductor chip and the substrate will have a tendency to fail because of the coefficient of thermal expansion mismatch. In addition, because of the very small size of the solder joints, the joints are subject to failures.

The strength of the solder joints between the integrated circuit chip and the substrate are typically enhanced by underfilling the space between the semiconductor chip and the substrate and around the solder joints. The underfill material is typically a polymer adhesive which reduces stress on the solder joints.

The conventional method of underfilling includes dispensing the underfill material in a fillet or bead extending along two or more edges of the chip and allowing the underfill material to flow by capillary action under the chip to fill all the gaps between the semiconductor chip and the substrate. The solder bumps create a very narrow gap between the semiconductor chip and the substrate which is about 0.002–0.005 inches (0.051–0.127 mm). Therefore, the underfill material which is capable of flowing through these narrow gaps contains only a small amount of filler material because the filler material will prevent the underfill material from flowing easily into the gaps. This type of underfill material with a low amount of filler material has an extremely high mismatch of coefficient of thermal expansion with the semiconductor chip, the solder bumps, and the substrate. Accordingly, it would be desirable to use an underfill material having more filler and thus, less of a thermal expansion coefficient mismatch with the substrate and chip.

An example of an integrated circuit chip 100 which has been attached to a substrate 102 by solder balls 104 and underfilled by a conventional method is illustrated if FIGS. 3 and 3*a*. The underfill material 106 has been drawn into the spaces between the solder balls 104 by capillary action to fill the air spaces between the integrated circuit chip 100 and the substrate 102.

The use of capillary action to suck the underfill material into the gap between the integrated circuit chip and the substrate takes between 5 and 20 minutes, depending on many factors including the size of the chip and the underfill material used. Another drawback of the conventional underfilling method is the occurrence of voids in the underfilling material.

Accordingly, a need exists for an underfilling method for completely filling the spaces between an integrated circuit chip and a substrate which can reliably underfill at a faster rate than known methods.

SUMMARY OF THE INVENTION

An integrated circuit chip package according to one aspect of the present invention includes an integrated circuit chip having an active surface with interconnection pads disposed thereon, and a substrate having a first surface with bonding pads substantially corresponding to the interconnection pads of the integrated circuit chip and a second side having a plurality of solder pads electrically interconnected with the bonding pads. A vent hole extends from the first side to the second side of the substrate, and is positioned beneath the integrated circuit chip when the chip is mounted on the substrate. A plurality of solder bumps electrically connect the interconnection pads of the integrated circuit chip with the bonding pads on the first side of the substrate. A molded underfill material is molded around the integrated circuit chip. The molded underfill material surrounds the solder bumps between the integrated circuit chip and the substrate and extends into the vent hole in the substrate.

A further aspect of the present invention relates to a method of underfilling an integrated circuit chip which has been electrically interconnected to a substrate. The method includes the steps of placing the integrated circuit chip and substrate within a mold cavity, injecting a mold compound into the mold cavity, underfilling a space between the integrated circuit chip and the substrate with the mold compound by the pressure of injection of the mold compound into the mold cavity, and allowing air to escape from between the integrated circuit chip and the substrate during underfilling through a vent in the substrate.

The present invention addresses the deficiencies of known underfilling methods by underfilling faster and more reliably than the known methods. In addition, the present invention forms an encapsulated integrated circuit chip package and performs underfilling in the same step.

BRIEF DESCRIPTION OF THE DRAWING FIGURES

The invention will be described in greater detail with reference to the accompanying drawings in which like elements bear like reference numerals, and wherein:

FIG. 1 is a top view of an integrated circuit chip with solder balls positioned on an active surface of the chip;

FIG. 2 is a side view of the integrated circuit chip of FIG. 1;

FIG. 3 is a side view of an integrated circuit chip mounted on a substrate and underfilled according to a prior art method;

Figure 6:
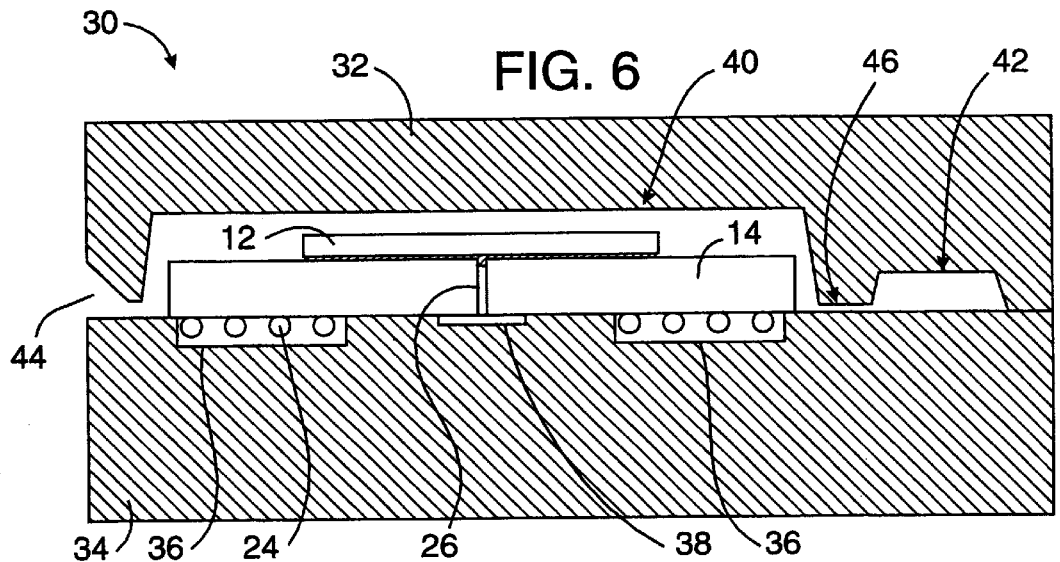
Figure 7:
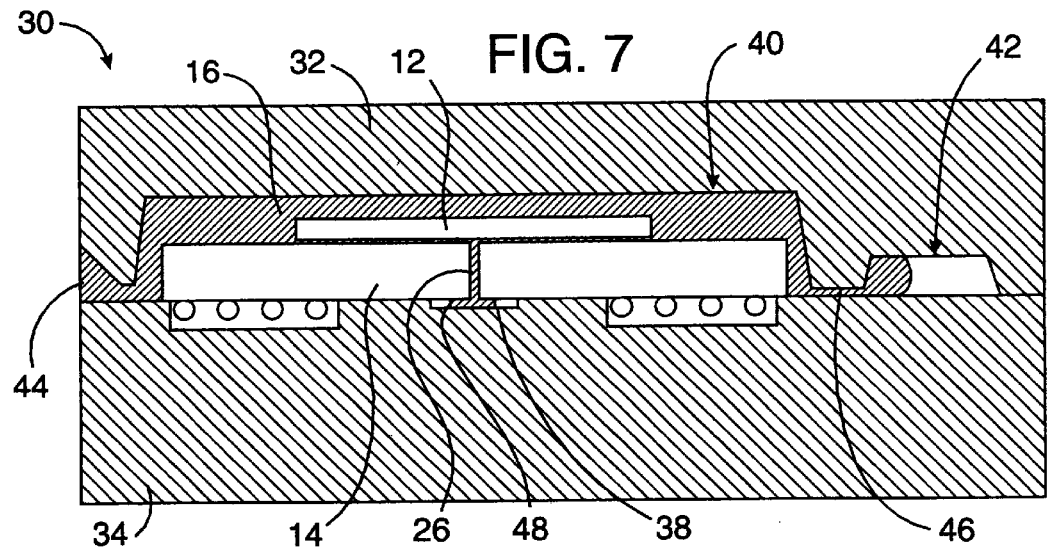
Figure 8:
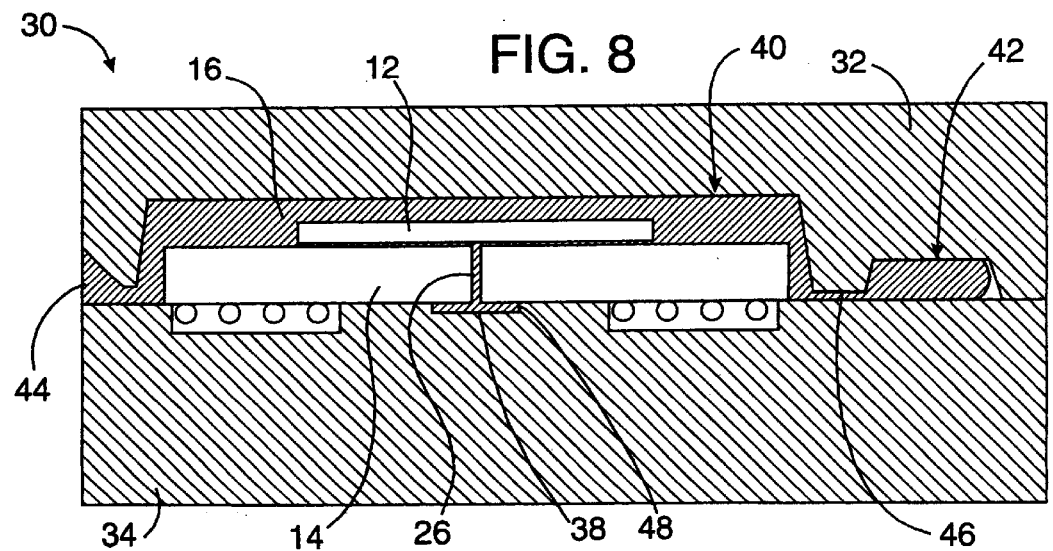

FIG. 3*a* is an enlarged side view of a portion of the chip and substrate of FIG. 3;

FIG. 4 is a cross-sectional side view of an integrated circuit chip mounted on a substrate which has been underfilled and encapsulated according to the present invention;

FIG. 4*a* is an enlarged cross-sectional side view of a portion of the integrated circuit chip of FIG. 4;

FIG. 5 is a cross-sectional side view of an alternative embodiment of an integrated circuit chip package according to the present invention;

FIG. 6 is a cross-sectional side view of an integrated circuit chip and substrate placed within a mold cavity according to the present invention;

FIG. 7 is a cross-sectional side view of the mold of FIG. 6 during underfilling; and FIG. 8 is a cross-sectional side view of the mold of FIG. 6 when underfilling has been completed.

DETAILED DESCRIPTION OF THE PREFERRED EMBODIMENTS

The integrated circuit chip package 10 according to the present invention is illustrated by way of example in FIG. 4 and includes an integrated circuit chip 12, a substrate 14, and a mold compound 16 encapsulating the chip and underfilling between the chip and the substrate. The integrated circuit chip package 10 is formed by transfer molding the package in a mold tool by a process which is described below with reference to FIGS. 6–8.

The integrated circuit chip package 10 according to the present invention can be made much faster than a similar package made using conventional underfilling techniques. In addition, the mold compound 16 used for underfilling also encapsulates the integrated circuit chip 12 in a single molding step.

With reference to FIGS. 1 and 2, the integrated circuit chip 12 has an active upper surface 18 having metal circuits thereon. A plurality of solder bumps 20 are formed on the active surface 18 of the integrated circuit chip 12 for electrical interconnection of the chip to the substrate 14. The patterns of the solder bumps 20 on the integrated circuit chip 12 will vary widely between chips and may have spaces between the solder bumps which are as small as approximately 0.002 inches (0.051 mm). The solder bumps 20 themselves have a height which is approximately 0.005 inches (0.127 mm).

The substrate 14, as shown in FIG. 4, includes an upper surface 22 having bonding pads (not shown) which are located to substantially correspond to the locations of the interconnection pads and solder bumps 20 on the active surface 18 of the integrated circuit chip 12. A lower surface 28 of the substrate 14 also has a plurality of solder pads (not shown) which are electrically interconnected with the bonding pads on the top side of the substrate. The solder pads on the underside of the substrate are each provided with substrate solder bumps 24 which allow electrical interconnection between the integrated chip package 10 and a circuit board. The solder bumps 24 may be replaced by pins or the solder pads may be used alone without the solder bumps. According to the present invention the substrate 14 includes a vent hole 26 extending between the upper surface 22 and the lower surface 28 of the substrate and positioned at or near a center of the integrated circuit chip 12.

When the integrated circuit chip 12 is positioned on the substrate 14 the solder bumps 20 are melted by a reflow furnace to connect the integrated circuit chip to the substrate. The reflowed chip and substrate are separated by a distance D which is 0.002 inches (0.051 mm) to 0.006 inches (0.152 mm), preferably approximately 0.003 inches (0.076 mm) to 0.005 inches (0.127 mm).

According to the present invention, the underfilling material or mold material 16 is provided between the integrated circuit chip 12 and the substrate 14 and surrounding each of the solder bumps 20. The underfill material 16 is a thermoset mold compound which is forced into air gaps between the chip and the substrate by the pressure of the mold compound being forced into the mold tool. The forcing of the mold compound 16 under the chip 12 to provide underfilling provides substantial time savings over the conventional method of allowing the underfill material to be drawn under the chip by capillary action.

The vent hole 26 extending through the substrate 14 allows air to escape from between the integrated circuit chip 12 and the substrate 16 as the mold compound is forced underneath the chip and prevents air pockets from becoming trapped by the mold compound. The vent hole 26 is preferably positioned near a center point of a chip receiving area on the substrate upper surface 22. However, the locations of the solder bumps 20 may require that the vent hole 26 be located somewhat displaced from the center of the chip receiving area on the substrate. Alternatively, multiple vent holes may be used. The vent hole 26 in the substrate 14 has a cross-sectional area which may vary depending on its location and the chip size and is preferably between 0.006 inches (0.152 mm) and 0.020 inches (0.50 mm).

With reference to FIGS. 6–8, the method of underfilling according to the present invention employs a mold 30 having a top half 32 and bottom half 34. The bottom half 34 of the mold is provided with cavities 36 for receiving the substrate solder bumps 24 on the lower side of the substrate. Alternatively, the mold cavities 36 may be eliminated and the substrate solder bumps 24 or pins may be attached after underfilling.

The bottom half 34 of the mold also includes a mold material overflow channel 38 which is positioned to receive mold material which passes through the central vent hole 26 in the substrate. Mold material which collects in the overflow channel 38 forms an overflow bead 48 of mold material on an underside of the substrate 14 as shown in FIGS. 4, 7, and 8.

The top half 32 of the mold defines an upper half of a mold cavity 40 and an upper half of an overflow cavity 42. Between the top and bottom halves of the mold 30, a mold compound inlet 44 is provided through which the mold material is introduced into the mold cavity 40. In addition, a vent 46 connects the mold cavity 40 to the overflow cavity 42.

The molding process of the present invention is a transfer molding process with an operating temperature between approximately 150° C. and 180° C. and material pressures of approximately 300–1000 psi (0.144–0.479 bars). The transfer molding composition used in the present invention, once cured, does not become flowable upon reheating.

When the mold material is injected into the mold cavity 40 through the inlet 44 as shown in FIG. 7, the mold compound fills the mold cavity surrounding the integrated circuit chip 12 and the sides of the substrate 14. The mold compound is also forced between the chip 12 and the substrate 14 into the air gaps which are present between the solder joints formed by the solder bumps 20.

A pressure within the mold cavity 40 must be carefully controlled while the underfilling process is performed to prevent the pressure within the mold cavity from exceeding a predetermined pressure threshold and pressing the chip 12 down onto the substrate with a force causing crushing of the solder bumps 20 before the underfilling process is complete. The mold cavity pressure is controlled by the mold vent 46 which allows some of the mold compound to escape from the mold cavity 40 into the overflow cavity 42. The size and shape of the mold vent 46 is particularly designed so that a predetermined threshold pressure within the mold cavity at which the solder bumps 20 would be crushed is not reached. The overflow cavity 42 accommodates a sufficient amount of mold compound to provide pressure control during the underfilling process. Once underfilling has been completed, and the solder bumps 20 are completely surrounded by the mold compound, there is no longer a risk of excessive pressure in the mold cavity 40 causing the solder bumps to be crushed.

During the underfilling process, the mold compound moves radially inwardly from each of the edges of the integrated circuit chip 12 until it reaches the vent hole 26 in the substrate. The mold compound then passes through the vent hole 26 into the overflow channel 38 in the bottom half of the mold 34 forming the overflow bead 48. The volume of mold compound which can be held in both the vent hole 26 and the overflow channel 38 are designed to allow mold material to continue to pass into the vent hole of the substrate 14 until all the air spaces between the integrated circuit chip 12 and substrate have been completely filled. The total transfer time for the mold cavity 40 to be filled and for underfilling to be completed is preferably between approximately 15 and 20 seconds. The cure time for the thermoset mold material to cure is then between about 60 and 200 seconds. After this cure time, the mold is opened and the integrated circuit chip package 10 is removed from the mold. The total cycle time for underfilling and encapsulation of the integrated circuit chip 12 in the present invention is significantly better than the time for underfilling alone with the known underfilling methods employing capillary action.

An apparatus for delivery of the mold compound to the mold inlet 44 may be any of the known delivery systems including those employing a plunger to press a mold compound in pellet form into the mold tool. Alternatively, a multiple plunger system may be used to control the pressure of the mold compound being pressed into each mold cavity when a plurality of cavities are being filled. The multiple plunger system may be used either with or without the use of an overflow cavity 42 for additional pressure regulation.

According to another variation of the present invention, an integrated circuit chip package 50 as shown in FIG. 5 is formed in which the integrated circuit chip 52 is mounted on a substrate 54 and is not fully encapsulated by a mold compound 56. According to this aspect of the invention the integrated chip package 50 is formed in a mold cavity having an upper mold half which engages a surface 58 of the integrated circuit chip 52. In this manner, the mold compound 56 surrounds the edges of the integrated circuit chip 52 and the edge of the substrate 54, but does not enclose the chip within the mold compound 56.

The integrated circuit chip package 50 shown in FIG. 5 is formed in the same manner as that of FIG. 4 by reflow soldering the integrated circuit chip to the substrate 54 by a plurality of solder pumps. The integrated circuit chip 52 and substrate 54 are then placed into a mold cavity and a transfer molding compound 56 is injected into the mold cavity around the integrated circuit chip 52 and substrate 54 and forced into the space between the chip and the substrate to underfill all gaps between the solder bumps. The modified integrated circuit chip package 50 of FIG. 5 does not require that precautions be taken to prevent crushing solder bumps due to the fact that pressure is not applied by the mold compound to the exposed backside surface 58 of the chip 52.

The transfer molding process according to the present invention may be used for a wide variety of integrated circuit chip shapes, sizes, and types. The transfer molding composition may be modified as known to those in the art to achieve different transfer times, cure times, flow characteristics, and post cure properties.

The mold compound 16 for use in the present invention includes a combination of one or more adhesive and one or more filler material. The filler material is between about 70 and 90 percent of the mold compound, preferably between 75 and 85 percent. The filler material may be silica, quartz, or any other known filler material having particle diameters which are preferably 0.35–2 mils (0.01–0.05 mm). The filler material particles may be formed in different shapes such as spherical, elongated, or irregularly shaped to achieve different flow characteristics. The adhesive material may be any known adhesive material, such as a novolac epoxy.

While the invention has been described in detail with reference to the preferred embodiments thereof, it will be apparent to one skilled in the art that various changes and modifications can be made, and equivalence employed without departing from the spirit and scope of the inventions.

What is claimed is:

1. An integrated circuit chip package comprising:
  an integrated circuit chip having an active surface with interconnection pads disposed thereon;
  a substrate having a first side with bonding pads substantially corresponding to the interconnection pads of the integrated circuit chip, a second side having a plurality of solder pads electrically interconnected with the bonding pads, and a vent hole, having a largest dimension of 0.020 inches, extending from the first side to the second side of the substrate and positioned beneath the integrated circuit chip when the chip is mounted on the substrate;
  a plurality of solder bumps electrically connecting the interconnection pads of the integrated circuit chip with the bonding pads on the first side of the substrate; and
  a molded underfill material molded around the integrated circuit chip, the molded underfill material surrounding the solder bumps between the integrated circuit chip and the substrate, and the molded underfill material extending into the vent hole in the substrate, wherein the molded underfill material overflows the vent hole and extends along a portion of the second side of the substrate.

2. The integrated circuit chip package according to claim 1, wherein the molded underfill material covers a backside of the integrated circuit chip encapsulating the chip.

3. The integrated circuit chip package according to claim 1, wherein the molded underfill material overflows the vent hole and extends along a portion the second side of the substrate.

4. The integrated circuit chip package according to claim 1, wherein the substrate includes edge surfaces and the molded underfill material covers the edge surfaces of the substrate.

5. The integrated circuit chip package according to claim 1, wherein the molded underfill material is epoxy.

6. The integrated circuit chip package according to claim 1, wherein the vent hole is positioned in the substrate at substantially a center of an area occupied by the integrated circuit chip.

7. The integrated circuit chip package according to claim 1, wherein the molded underfill material includes epoxy and between 70 and 90 percent filler material.

8. The integrated circuit chip package according to claim 1, wherein a distance between the integrated circuit chip and the substrate is approximately 0.002–0.006 inches.

9. An integrated circuit chip package comprising:

an integrated circuit chip having an active surface with interconnection pads disposed thereon;

a substrate having a first side with bonding pads substantially corresponding to the interconnection pads of the integrated circuit chip, a second side having a plurality of solder pads electrically interconnected with the bonding pads, a plurality of edge surfaces, and a vent hole extending from the first side to the second side of the substrate and positioned beneath the integrated circuit chip when the chip is mounted on the substrate;

a plurality of solder bumps electrically connecting the interconnection pads of the integrated circuit chip with the bonding pads on the first side of the substrate; and a molded underfill material molded around the substrate such that the molded underfill material is provided between the integrated circuit chip and the substrate, said molded underfill material extending into the vent hole in the substrate and covering portions of the first side and at least one of the plurality of edge surfaces of said substrate, wherein the molded underfill material covers a portion of the second side of the substrate.

10. The integrated circuit chip package of claim 9, wherein the molded underfill material covers the first side and at least four edge surfaces of the substrate.

11. The integrated circuit chip package of claim 9, wherein the molded underfill material encapsulates the integrated circuit chip.

12. The integrated circuit chip package of claim 9, wherein the molded underfill material covers a portion of the second side of the substrate.

* * * * *